US012726164B2

(12) United States Patent
Han

(10) Patent No.: US 12,726,164 B2
(45) Date of Patent: Sep. 1, 2026

(54) AMPLIFIER CIRCUIT FOR MICROPHONE, MICROPHONE CIRCUIT AND ELECTRONIC DEVICE

(71) Applicant: AAC Technologies Pte. Ltd., Singapore (SG)

(72) Inventor: Dong Han, Singapore (SG)

(73) Assignee: AAC Technologies Pte. Ltd., Singapore (SG)

(*) Notice: Subject to any disclaimer, the term of this patent is extended or adjusted under 35 U.S.C. 154(b) by 424 days.

(21) Appl. No.: 18/406,262

(22) Filed: Jan. 8, 2024

(65) Prior Publication Data

US 2025/0226805 A1 Jul. 10, 2025

(51) Int. Cl.
*H03F 13/00* (2006.01)
*H03F 3/181* (2006.01)
*H03F 3/30* (2006.01)

(52) U.S. Cl.
CPC .......... *H03F 13/00* (2013.01); *H03F 3/3033* (2013.01); *H03F 3/3038* (2013.01); *H03F 2200/121* (2013.01); *H03F 2200/372* (2013.01); *H03F 2200/504* (2013.01); *H03F 2200/522* (2013.01)

(58) Field of Classification Search
CPC ...... H03F 13/00; H03F 3/3033; H03F 3/3038; H03F 2200/121; H03F 2200/372; H03F 2200/504; H03F 2200/522; H03F 1/301; H03F 1/307; H03F 3/183; H03F 3/185; H03F 2200/03; H03F 3/213; H04R 3/00; H04R 2430/00
USPC .................................................... 330/5, 297
See application file for complete search history.

(56) References Cited

U.S. PATENT DOCUMENTS 9,900,708 B2 * 2/2018 Vinter .................... H04R 25/30

* cited by examiner

*Primary Examiner* — Hieu P Nguyen
(74) *Attorney, Agent, or Firm* — Wiersch Law Group

(57) ABSTRACT

An amplifier circuit for a microphone, a microphone circuit and an electronic device are provided. The amplifier circuit includes a voltage regulator having an output terminal, a first constant current source having an input terminal connected to the output terminal of the voltage regulator, a first transistor having a gate serving as an input terminal of the amplifier circuit and a source serving as an output terminal of the amplifier circuit, a second transistor having a source connected to an output terminal of the first constant current source, a gate connected to the source of the first transistor and a drain connected to ground, a first driver configured to achieve high power supply rejection ratio of the amplifier circuit and a second driver configured to achieve high acoustic overload point of the amplifier circuit.

19 Claims, 2 Drawing Sheets

AMPLIFIER CIRCUIT FOR MICROPHONE, MICROPHONE CIRCUIT AND ELECTRONIC DEVICE

TECHNICAL FIELD

The various embodiments described in this document relate in general to the technical field of microphones, and more specifically to an amplifier circuit for a microphone, a microphone circuit and an electronic device.

BACKGROUND

With the development of mobile communication technology, cell phones, smart speakers, laptop computers, etc. have become common electronic products in life. A microphone circuit mounted in these electronic products usually include a microphone as well as an amplifier circuit for the microphone. The microphone, as a sound pickup unit, is used to convert sound signals into electrical signals, and the amplifier circuit is used to drive the signals output from the microphone and output them to a subsequent component.

Various performance parameters, such as signal-to-noise ratio (SNR for short), load driving capability, power supply rejection ratio (PSRR for short), and acoustic overload point (AOP for short), of an amplifier circuit have a significant impact on the effect and performance of subsequent components, so the above performance parameters are important indicators for evaluating the performance of an electronic product. However, the performance of current microphone amplifier circuits needs to be improved.

SUMMARY

In some embodiments, an amplifier circuit of a microphone, a microphone circuit and an electronic device are provided, so as to at least facilitate the improvement of electrical performance of the microphone circuit.

In some embodiments, an amplifier circuit for a microphone is provided. The amplifier circuit includes a voltage regulator, a first constant current source, a first transistor, a first driver and a second driver. The voltage regulator has an output terminal and the first constant current source has an input terminal connected to the output terminal of the voltage regulator. The first transistor has a gate serving as an input terminal of the amplifier circuit, and a source serving as an output terminal of the amplifier circuit. The second transistor has a source connected to an output terminal of the first constant current source, a gate connected to the source of the first transistor, and a drain connected to ground. The first driver is configured to achieve high power supply rejection ratio of the amplifier circuit, and has a first end connected to the output terminal of the voltage regulator, a second end connected to the source of the second transistor, a third end connected to the source of the first transistor, a fourth end connected to the drain of the first transistor, and a fifth end connected to the ground. The second driver is configured to achieve high acoustic overload point of the amplifier circuit, and has a first end connected to a power supply, a second end connected to the output terminal of the voltage regulator, a third end connected to the source of the first transistor, a fourth end connected to the drain of the first transistor, and a fifth end connected to the ground.

In some embodiments, the amplifier circuit includes a bias resistor, having a first end connected to the drain of the first transistor and a second end connected to the ground.

In some embodiments, the first and second transistors are P-channel metal oxide semiconductor (PMOS for short) transistors.

In some embodiments, the voltage regulator is a low dropout regulator (LDO for short).

In some embodiments, the first driver includes a bias current source, a third transistor, a fourth transistor, a fifth transistor and a sixth transistor. The bias current source has an input terminal serving as the first end of the first driver. The third transistor has a gate serving as the fourth end of the first driver, a source serving as the fifth end of the first driver, and a drain serving as the third end of the first driver. The fourth transistor has a gate connected to the gate of the third transistor, a source connected to the source of the third transistor and a drain connected to an output terminal of the bias current source. The fifth transistor has a source connected to the drain of the third transistor and a gate connected to the drain of the fourth transistor. The sixth transistor has a gate serving as the second end of the first driver, a drain connected to the output terminal of the voltage regulator, and a source connected to a drain of the fifth transistor.

In some embodiments, the first driver further includes a capacitor, having a first end connected to the gate of the fifth transistor, and a second end connected to the gate of the third transistor.

In some embodiments, the third transistor, the fourth transistor, the fifth transistor, and the sixth transistor are N-channel metal oxide semiconductor (NMOS for short) transistors.

In some embodiments, the second driver includes a second constant current source, a seventh transistor, an eighth transistor, a ninth transistor, a tenth transistor and an eleventh transistor. The second constant current source has an input terminal serving as the second end of the second driver. The seventh transistor has a gate serving as the fourth end of the second driver, a source serving as the fifth end of the second driver, and a drain connected to an output terminal of the second constant current source. The eighth transistor has a source connected to the source of the seventh transistor, a drain connected to the drain of the seventh transistor, and a gate connected to the drain of the eighth transistor. The ninth transistor has a source connected to the source of the seventh transistor, a gate connected to the gate of the eighth transistor. The tenth transistor has a source serving as the first end of the second driver, a drain serving as the third end of the second driver, and a gate connected to a drain of the ninth transistor. The eleventh transistor has a source connected to the source of the tenth transistor, a gate connected to the gate of the tenth transistor, and a drain connected to the gate of the eleventh transistor. Herein, a voltage output from the voltage regulator is lower than a voltage of the power supply.

In some embodiments, the seventh transistor, the eighth transistor, and the ninth transistor are NMOS transistors, and the tenth and eleventh transistors are PMOS transistors.

In some embodiments, a microphone circuit is provided. The microphone circuit includes a microphone and an amplifier circuit as described above. The microphone has a first end connected to a microphone bias voltage, and a second end connected to the input terminal of the amplifier circuit.

In some embodiments, an electronic device is provided. The electronic device includes an amplifier circuit for a microphone as described above, or a microphone circuit as described above.

According to the embodiments of the present disclosure, when the signal received at the input terminal of the amplifier circuit is a small signal, the first driver is turned on, the second driver is turned off, and the first driver in the turned-on state makes the more stable signal output from the voltage regulator be used as the power supply signal, which is conducive to improving the power supply rejection ratio of the amplifier circuit. When the signal received at the input terminal of the amplifier circuit is a large signal, the second driver is turned on, and the power supply is used as the power supply signal, which is conducive to ensuring that the amplifier circuit has a high acoustic overload point. In addition, the amplifier circuit provided in the above embodiments adopts a single-stage amplifier to realize outputting a load signal with a high driving ability without additional amplifiers boosting the driving ability of the load signal, so as to ensure that the amplifier circuit outputs a load signal with a high driving ability, and to ensure that the amplifier circuit as a whole has a high signal-to-noise ratio.

BRIEF DESCRIPTION OF THE DRAWINGS

The embodiments of the present disclosure are illustrated by way of example and not limitation in the figures of the accompanying drawings, in which like references may indicate similar elements.

DETAILED DESCRIPTION OF THE EMBODIMENTS

As can be seen from the background, the performance of an amplification circuit for a microphone, such as signal-to-noise ratio, load driving capability, and power supply rejection ratio, has a significant impact on the effect and performance of the subsequent components, and the performance of current microphone amplifier circuits needs to be improved.

Figure 1:
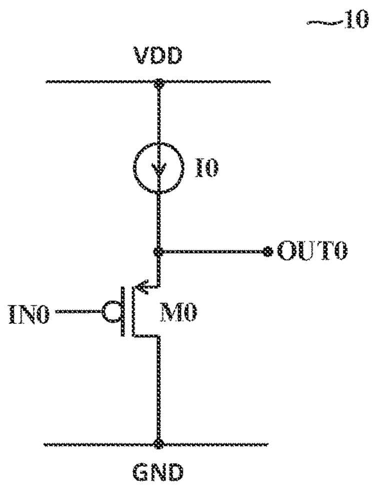
FIG. 1 is a schematic diagram of a structure of an amplifier circuit for a microphone in accordance with the related art.

FIG. 1 is a schematic diagram of a structure of an amplifier circuit for a microphone in accordance with the related art. Referring to FIG. 1, the amplifier circuit 10 has an input terminal IN0 configured to receive an acoustic signal from an external microphone, and an output terminal OUT0 configured to output a signal obtained by the amplifier circuit 10 amplifying the acoustic signal. Specifically, the amplifier circuit 10 includes a constant current source I0 and a transistor M0. The transistor M0 has a gate serving as the input terminal IN0 of the amplifier circuit 10, a source serving as the output terminal OUT0 of the amplifier circuit 10 and a drain connected to ground GND. The constant current source I0 has an input terminal connected to a power supply VDD, and an output terminal connected to the source of the transistor M0.

An ideal current source has an output impedance with an infinite value, and the output current of the ideal current does not change as the load varies. However, in general, in the amplifier circuit as shown in FIG. 1, the constant current source I0 is not an ideal current source and the output impedance of the constant current source I0 is not large enough, so that the output signal Vout0 is susceptible to fluctuations of the constant current source I0, and thus the power supply rejection ratio of the amplifier circuit 10 is relatively low. In addition, in the amplifier circuit 10, the main part that assumes the amplification function is a source follower constituted by the transistor M0, the voltage of the input signal Vin0 is the same as the voltage of the output signal Vout0, and the gain of the amplifier is 1. Thus, the output driving ability of the amplifier circuit 10 is relatively low. If an additional amplifier is added, for example, a second buffer amplifier is added to enhance the output driving ability of the amplifier circuit 10, leading to a low signal-to-noise ratio of the amplifier circuit 10 as a whole.

In order to solve the above problem, an amplifier circuit for a microphone is provided in accordance with some embodiments of the present disclosure, so as to facilitate the improvement of the power supply rejection ratio of the amplifier circuit and to ensure that the microphone circuit has a high acoustic pressure overload point. In addition, it is ensured that the amplifier circuit outputs a load signal with a relatively high driving ability and that the amplifier circuit as a whole has a high signal-to-noise ratio.

Various embodiments of the present disclosure will be described in detail below in combination with the accompanying drawings. However, a person of ordinary skill in the art should understand that, in the various embodiments of the present disclosure, a number of technical details have been proposed in order to enable the reader to better understand the embodiments of the present disclosure. However, even without these technical details and various changes and modifications based on the following embodiments, the technical solutions claimed to be protected by the embodiments of the present disclosure can be realized.

Figure 2:
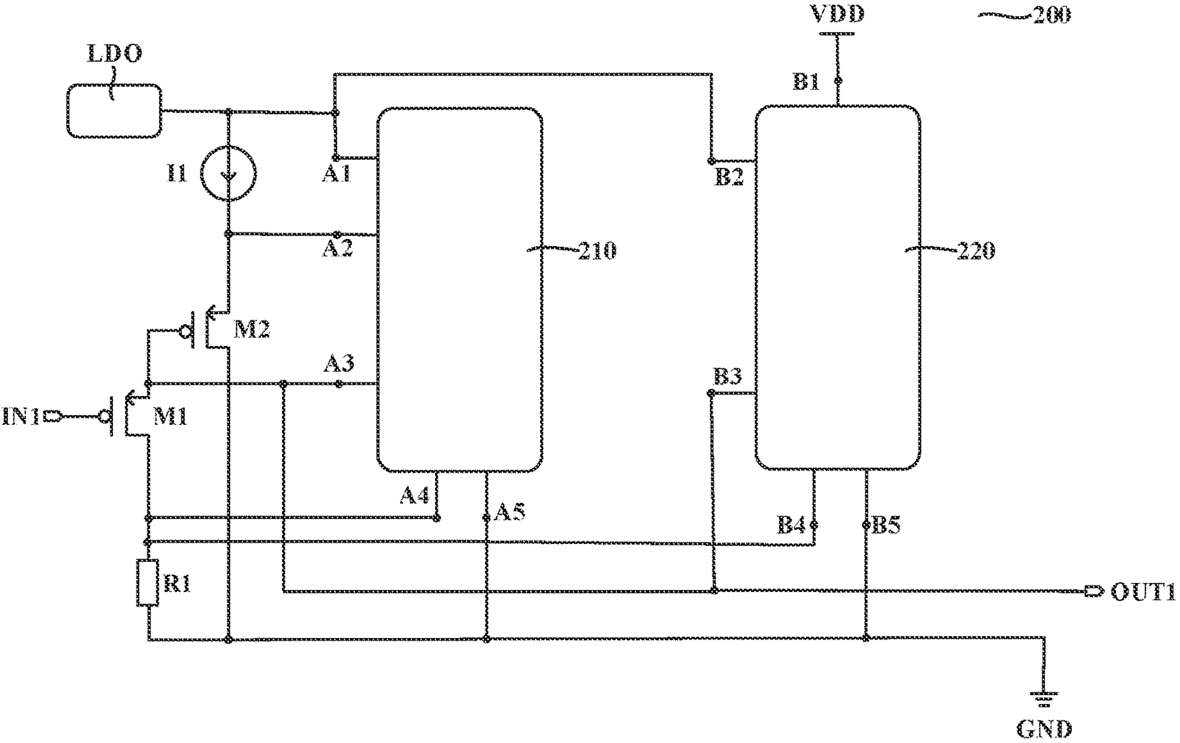
FIG. 2 is a schematic diagram illustrating a structure of an amplifier circuit for a microphone in accordance with some embodiments.

FIG. 2 is a schematic diagram illustrating a structure of an amplifier circuit for a microphone in accordance with some embodiments of the present disclosure.

Referring to FIG. 2, the amplifier circuit 200 has an input terminal IN1 configured to receive an acoustic pressure signal from an external microphone, and an output terminal OUT1 configured to output a signal obtained by the amplifier circuit 200 amplifying the acoustic pressure signal.

The microphone amplification circuit 200 includes a voltage regulator LDO and a first constant current source I1. An input terminal of the first constant current source I1 is connected to an output terminal of the voltage regulator LDO.

In some embodiments, the voltage regulator is a low dropout regulator (LDO for short).

LDO is used to stabilize the output of a fixed voltage value based on the input voltage. LDO can automatically adjust the output voltage when the power supply voltage fluctuates or the load varies, so as to maintain the output of a constant voltage value. Thus, LDO is used to make the load signal outputted by the amplifier circuit 200 less affected by the fluctuation of the power supply signal, which is conducive to improving the power supply rejection ratio of the amplifier circuit 200, and improving the electrical performance of the amplifier circuit 10.

Referring to FIG. 2, the amplifier circuit 200 further includes a first transistor M1 and a second transistor M2. The first transistor M1 has a gate serving as the input terminal IN1 of the amplifier circuit 200, a source serving as the output terminal OUT1 of the amplifier circuit 200, and a drain connected to ground GND. The second transistor M2 has a source connected to the output terminal of the first constant current source I1, a gate connected to the source of the first transistor M1, and a drain connected to the ground GND.

The amplifier circuit 200 provided by the embodiments of the present disclosure adopts a single-stage amplifier to realize outputting load signals with high driving ability, and does not need to add additional amplifiers to enhance the driving ability of the load signals, so as to not only facilitate the output of load signals with relatively high driving ability, but also ensure that the amplifier circuit 200 has a high signal-to-noise ratio as a whole.

In some embodiments, the first transistor M1 and the second transistor M2 are PMOS transistors.

In some embodiments, the amplifier circuit 200 further includes a bias resistor R1. In this case, the drain of the first transistor M1 is connected to the ground GND through the bias resistor R1. Specifically, the bias resistor R1 has a first end connected to the drain of the first transistor M1, and a second end connected to the ground GND.

The main part of the amplifier circuit 200 that performs the amplification function is a source follower constituted by the first transistor M1, and the bias resistor R1 is used to provide a bias current and thus provides the first transistor M1 with a sink current to the ground GND. The second transistor M2 and the first constant current source I1 constitute a source follower, which is used as a level shifter to increase the voltage value of the source of the first transistor M1, and in this way, it is beneficial to enhance the output driving ability of the amplifier circuit 200.

With continued reference to FIG. 2, the amplifier circuit 200 further includes a first driver 210 and a second driver 220. The first driver 210 is used to increase the power supply rejection ratio of the amplifier circuit 200. The second driver 220 is used to boost the acoustic overload point of the amplifier circuit 200. The first driver 210 has a first end A1 connected to the output terminal of the voltage regulator LDO, a second end A2 connected to the output terminal of the first constant current source I1, a third end A3 connected to the source of the first transistor M1, a fourth end A4 connected to the drain of the first transistor M1, and a fifth end A5 connected to the ground GND. The second driver 220 has a first end B1 connected to the power supply VDD, a second end B2 connected to the output terminal of the voltage regulator LDO, a third end B3 connected to the source of the first transistor M1, a fourth end B4 connected to the drain of the first transistor M1, and a fifth end B5 connected to the ground GND.

When an external acoustic pressure received by an external microphone is low, an amplitude of the acoustic pressure signal output by the microphone is small, i.e., the signal received at the input terminal IN1 of the amplifier circuit 200 is small. If the signal received at the input terminal IN1 of the amplifier circuit 200 is a small signal, the fluctuation of the power supply is more likely to affect the load signal output by the amplifier circuit 200, i.e., the harmonics in the load signal due to the fluctuation of the power supply have a greater effect on the load signal. In the embodiments of the present disclosure, when the signal received at the input terminal IN1 of the amplifier circuit 200 is a small signal, the first driver 210 is turned on and the second driver 220 is turned off, so that the first driver 210 in the turned-on state makes the more stable signal output from the voltage regulator LDO serve as the power supply, and the more stable power supply signal makes the load signals output from the amplifier circuit 200 less affected by fluctuations in the power supply VDD, which is conducive to improving the power supply rejection ratio of the amplifier circuit 200, and improving the electrical performance of the amplifier circuit 200.

When the external acoustic pressure received by the external microphone is large, the amplitude of the acoustic pressure signal output by the microphone is large, i.e., the signal received at the input terminal IN1 of the amplifier circuit 200 is a large signal. When the signal received at the input terminal IN1 of the amplifier circuit 200 is a large signal, the second driver 220 is turned on. Since the voltage output from the voltage regulator LDO is lower than the voltage of the power supply VDD, the power supply VDD is used as the power supply signal, which avoids the load signals from being restricted by the voltage regulator LDO, and helps to ensure that the microphone circuit as a whole has a high acoustic overload point.

Figure 3:
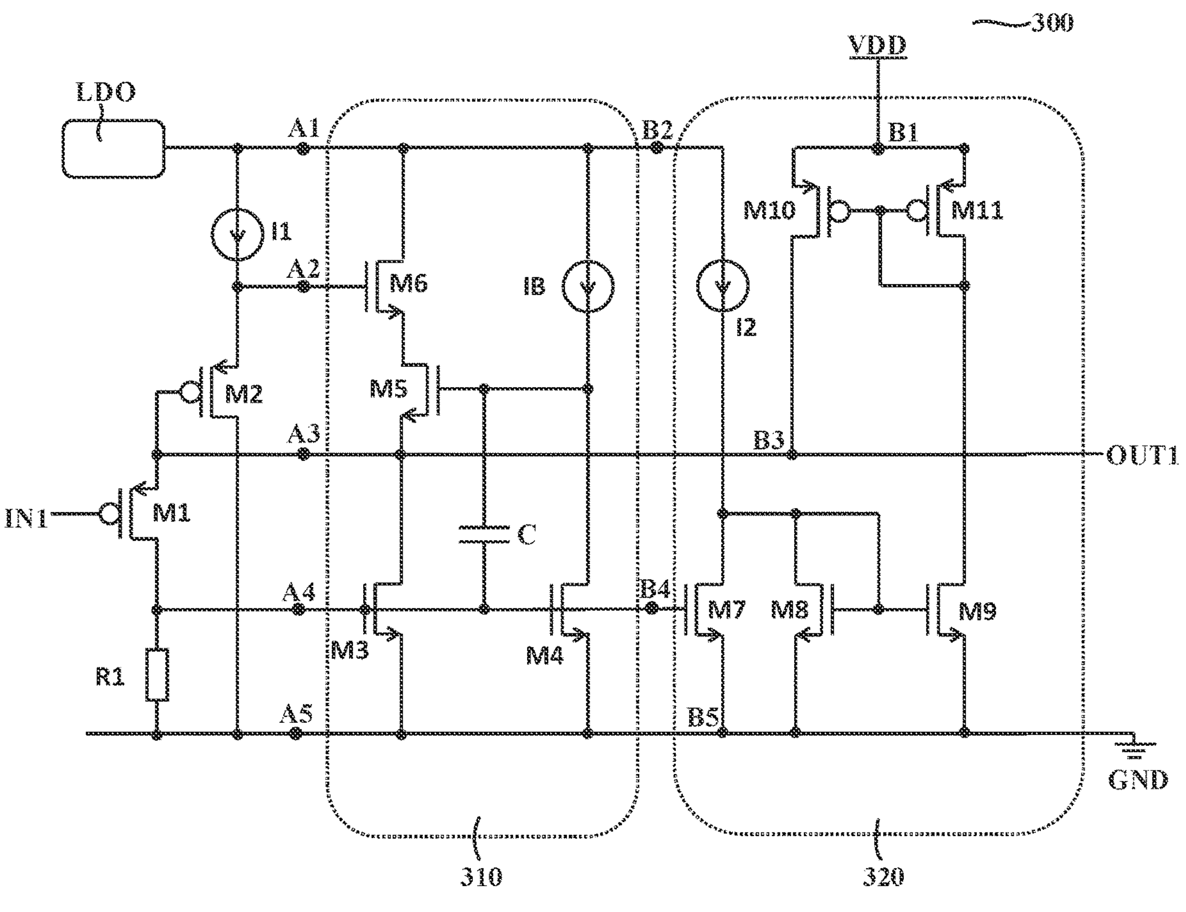
FIG. 3 is a schematic diagram illustrating another structure of an amplifier circuit for a microphone in accordance with some embodiments.

FIG. 3 is a schematic diagram illustrating another structure of an amplifier circuit for a microphone in accordance with some embodiments. The amplifier circuit 300 as shown in FIG. 3 has a similar structure as the amplifier circuit 200 as shown in FIG. 2, except for the first driver 310 and the second driver 320. The elements in FIG. 3 that are similar as that in FIG. 2, are not gone into detail herein.

Referring to FIG. 3, the first driver 310 includes a bias current source IB, a third transistor M3, a fourth transistor M4, a fifth transistor M5 and a sixth transistor M6. The bias current source IB has an input terminal connected to the output terminal of the voltage regulator LDO and serving as a first terminal A1 of the first driver 310, and an output terminal. The third transistor M3 has a gate connected to the drain of the first transistor M1 and serving as a fourth terminal A4 of the first driver 310, a source connected to the ground GND and serving as a fifth terminal A5 of the first driver 310, a drain connected to the source of the first transistor M1 and serving as a third end A3 of the first driver 310. The fourth transistor M4 has a gate connected to the gate of the third transistor M3, a source connected to the source of the third transistor M3, and a drain connected to the output terminal of the bias current source IB. The fifth transistor M5 has a source connected to the drain of the third transistor M3, a gate connected to the drain of the fourth transistor M4 and a drain. The sixth transistor M6 has a gate connected to the source of the second transistor M2 and serving as a second end A2 of the first driver 310, a drain connected to the output terminal of the voltage regulator LDO, and a source connected to the drain of the fifth transistor M5.

The fourth transistor M4, the bias current source IB and the bias resistor R1 are used to provide a bias current, which provides the first transistor M1 with a sink current with respect to the ground GND. The second transistor M2 and the first constant current source I1 are used to provide a bias voltage to the gate of the sixth transistor M6. The fifth transistor M5 is used to provide current from the amplifier circuit 300 to the external circuit, and the third transistor M3 is used to provide current from the external circuit to the amplifier circuit 300, such that the amplifier circuit 300 has a push and/or pull driving ability.

When a voltage value of a signal received at the input terminal IN1 of the amplifier circuit 300 is increased, the gate voltage of the first transistor M1, the gate voltage of the second transistor M2, and the gate voltage of the sixth transistor M6 are increased, and the gate voltage of the third transistor M3 and the gate voltage of the fourth transistor M4 are decreased. The channel current of the fifth transistor M5 becomes larger, the channel current of the third transistor M3 and the channel current of the fourth transistor M4 become smaller. Therefore, the current flowing from the source of the fifth transistor M5 is shunted by the first transistor M1 and the third transistor M3, and the remainder of the current flows out through the output terminal OUT1.

When a voltage value of a signal received at the input terminal IN1 of the amplifier circuit 300 is decreased, the gate voltage of the first transistor M1, the gate voltage of the second transistor M2 and the gate voltage of the sixth transistor M6 are decreased, the gate voltage of the third transistor M3 and the gate voltage of the fourth transistor M4 are increased, the channel current of the fifth transistor M5 becomes smaller, and the channel currents of the third transistor M3 and the channel current of the fourth transistor M4 become larger. Therefore, the third transistor M3 forms a current sink after receiving the currents flowing in from the fifth transistor M5 and from the first transistor M1, so that an external circuit or a load may flow a relatively large current into the third transistor M3 through the output terminal OUT1 of the amplifier circuit 300.

In view of above, the amplifier circuit 300 may flow a large current from the output terminal OUT1 to an external circuit, or a large current may be flowed from the output terminal OUT1 to the interior of the amplifier circuit 300.

In some embodiments, the third transistor M3, the fourth transistor M4, the fifth transistor M5 and the sixth transistor M6 are NMOS transistors.

In some embodiments, the first driver 310 further includes a capacitor C. A first end of the capacitor C is connected to the gate of the fifth transistor M5, and a second end of the capacitor C is connected to the gate of the third transistor M3.

In some embodiments, referring to FIG. 3, the second driver 320 includes a second constant current source 12, a seventh transistor M7, an eighth transistor M8, a ninth transistor M9, a tenth transistor M10 and an eleventh transistor M11. The second constant current source 12 has an input terminal connected to the voltage regulator LDO and serving as a second end B2 of the second driver 320, and an output terminal. The seventh transistor M7 has a gate connected to the drain of the first transistor M1 and serving as a fourth end B4 of the second driver 320, a source connected to the ground and serving as a fifth end B5 of the second driver 320, and a drain connected to the output terminal of the second constant current source 12. The eighth transistor M8 has a source connected to the source of the seventh transistor M7, a drain connected to the drain of the seventh transistor M7, and a gate connected to the drain of the eighth transistor M8. The ninth transistor M9 has a source connected to the source of the seventh transistor M7, a gate connected to the gate of the eighth transistor M8, and a drain. The tenth transistor M10 has a source connected to the power supply VDD and serving as a first end B1 of the second driver 320, a drain connected to the source of the first transistor M1 and serving as a third end B3 of the second driver 320, and a gate connected to the drain of the ninth transistor M9. The eleventh transistor M11 has a source connected to the source of the tenth transistor M10, a gate connected to the gate of the tenth transistor M10, and a drain connected to the gate of the eleventh transistor M11.

In the second driver 320, the eighth transistor M8, the ninth transistor M9, the tenth transistor M10, and the eleventh transistor M11 form a current mirror, which is configured to amplify a net current obtained by subtracting a current flowing through the seventh transistor M7 from the current output from the second constant current source 12.

The first driver 310 is always in a turned-on state, and the power supply voltage is provided by the voltage regulator LDO, which facilitates a high power supply rejection ratio. However, since the voltage output from the voltage regulator LDO is lower than the voltage of the power supply VDD, if the voltage regulator LDO is still used to provide the power supply signal when the voltage value of the signal received at the input terminal IN1 of the amplifier circuit 300 is relatively high, the internal signals of the first driver 310 may be clamped by the voltage output from the voltage regulator LDO, and cannot reach the voltage of the power supply VDD, resulting in that the acoustic overload point is relatively lower. In order to solve this problem, the second driver 320 is provided by the embodiments of the present disclosure. Since the power supply rejection ratio has a negligible effect on the load signal when the voltage value of the signal received at the input terminal IN1 of the amplifier circuit 300 is relatively high, the second driver 320 is turned on to raise the upper limit of the voltage of the load signal to the voltage of the power supply VDD, so that the voltage of the load signal is not clamped by the voltage output from the voltage regulator LDO. Therefore, the second driver 320 is provided to ensure that the microphone circuit as a whole has a high acoustic overload point.

When the voltage value of the signal received at the input terminal IN1 of the amplifier circuit 300 is increased, the gate voltage of the seventh transistor M7 is decreased and the channel current of the seventh transistor M7 becomes smaller. When the voltage value of the signal received at the input IN1 of the amplifier circuit 300 is further increased, the gate voltage of the seventh transistor M7 is further decreased and the channel current of the seventh transistor M7 is further decreased. When the channel current of the seventh transistor M7 is less than the output current of the constant current source 12, the net current obtained by subtracting the channel current of the seventh transistor M7 from the output current of the constant current source 12 is amplified by the current mirror and the current is output outwardly through the tenth transistor M10. At this time, the second driver 320 is in the turned-on state.

It should be noted that due to the limited output impedance of the current mirror formed by the eleventh transistor M11 and the tenth transistor M10, the power supply rejection ratio of the second driving unit 320 in the turned-on state is relatively low. Thus, the second driver 320 is turned on when the voltage value of the signal received at the input terminal IN1 of the amplifier circuit 300 is sufficiently large so that the output current of the second constant current source 12 is greater than the channel current of the seventh transistor M7. In this way, when the voltage value of the signal received at the input terminal IN1 of the amplifier circuit 300 is relatively small, the reduction of the power supply rejection ratio due to the turned-on of the second driving unit 320 is avoided.

Furthermore, it should be noted that the current supplied by the second constant current source 12 to the drain of the seventh transistor M7 flows through the seventh transistor M7 to form a current flowing out of the source of the seventh transistor M7. When the voltage value of the signal received at the input terminal IN1 of the amplifier circuit 300 is increased, the gate voltage of the seventh transistor M7 decreases, and when the channel current of the seventh transistor M7 is less than the output current of the second constant current source 12, the current flowing out from the second constant current source 12, after being shunted by the seventh transistor M7, is amplified by the current mirror, and then flows out from the output terminal OUT1 of the amplifier circuit 300 through the tenth transistor M10.

In some embodiments, the seventh transistor M7, the eighth transistor M8, and the ninth transistor M9 are NMOS transistors, and the tenth transistor M10 and the eleventh transistor M11 are PMOS transistors.

The amplifier circuit 300 provided in the above embodiments adopts a single-stage amplifier to realize outputting a load signal with a high driving ability, so as to ensure that the amplifier circuit 300 outputs a load signal with a high driving ability, and to ensure that the amplifier circuit 300 as a whole has a high signal-to-noise ratio. When the signal received at the input terminal IN1 of the amplifier circuit 300 is a small signal, the first driver 310 is turned on, and the second driver 320 is turned off, and the first driver 310 in the turned-on state makes the more stable signal output from the voltage regulator LDO be used as the power supply signal, which is conducive to improving the power supply rejection ratio of the amplifier circuit 300. When the signal received at the input terminal IN1 of the amplifier circuit 300 is a large signal, and makes the output current of the second constant current source 12 greater than the channel current of the seventh transistor IM7, the second driver 320 is turned on, and the power supply VDD is used as the power supply signal, which is conducive to ensuring that the amplifier circuit 300 still has a high acoustic overload point. It should be noted that only when the signal received at the input terminal IN1 is a large and positive signal, which makes the output current of the second constant current source 12 greater than the channel current of the seventh transistor IM7, the second driver 320 is turned on. If the signal received at the input terminal IN1 is large but negative, the channel current of the seventh transistor IM7 is greater than the output current of the second constant current source 12, and the second driver 320 is still in the turned-off state. Here, positive means the signal received at the input terminal IN1 is higher than the DC bias, negative means the signal received at the input terminal IN1 is lower than DC bias. Small signal or large signal referred as the signal amplitude.

Figure 4:
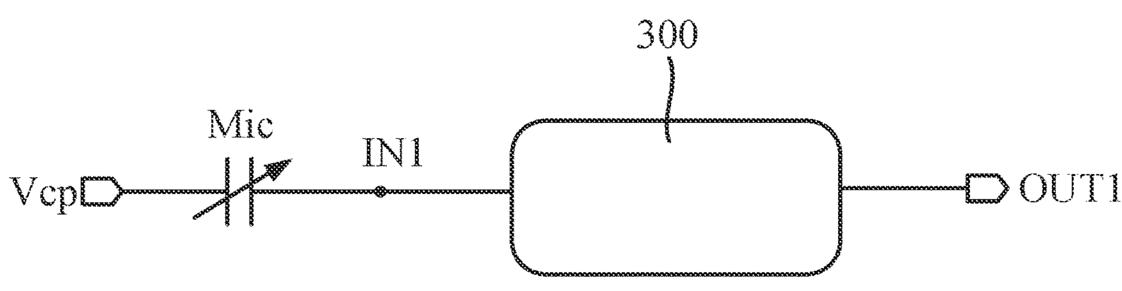
FIG. 4 is a schematic diagram illustrating a structure of a microphone circuit in accordance with some embodiments.

FIG. 4 is a schematic diagram illustrating a structure of a microphone circuit in accordance with some embodiments.

Referring to FIG. 4, the microphone circuit includes a microphone Mic and the amplifier circuit 300 as described in any of the above embodiments. The microphone Mic has a first end connected to a microphone bias voltage Vcp, and a second end connected to an input terminal IN1 of the amplifier circuit 300.

According to the embodiments of the present invention, an electronic device is provided. The electronic device includes an amplifier circuit for a microphone as described in any one of the above embodiments, or includes a microphone circuit as described in any one of the above embodiments.

It will be understood that, although the terms first, second, etc., are, in some instances, used herein to describe various elements, these elements should not be limited by these terms. These terms are only used to distinguish one element from another. For example, a first transistor could be termed a second transistor, and, similarly, a second transistor could be termed a first transistor, without departing from the scope of the various described embodiments. The first constant current source and the second constant current source are both constant current source, but they are not the same condition unless explicitly stated as such.

When a certain part "includes" another part throughout the specification, other parts are not excluded unless otherwise stated, and other parts may be further included. In addition, when parts such as a transistor, is referred to as being "connected to" another part, it may be "directly connected to" another part or may have another part present therebetween. In addition, when a part is "directly connected to" another part, it means that no other part is positioned therebetween.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. An amplifier circuit for a microphone, comprising:
a voltage regulator, having an output terminal;
a first constant current source, having an input terminal connected to the output terminal of the voltage regulator;
a first transistor, having a gate serving as an input terminal of the amplifier circuit, a source serving as an output terminal of the amplifier circuit, and a drain;
a second transistor, having a source connected to an output terminal of the first constant current source, a gate connected to the source of the first transistor, and a drain connected to ground;
a first driver, configured to achieve high power supply rejection ratio of the amplifier circuit and having a first end connected to the output terminal of the voltage regulator, a second end connected to the source of the second transistor, a third end connected to the source of the first transistor, a fourth end connected to the drain of the first transistor, and a fifth end connected to the ground; and
a second driver, configured to achieve high acoustic overload point of the amplifier circuit and having a first end connected to a power supply, a second end connected to the output terminal of the voltage regulator, a third end connected to the source of the first transistor, a fourth end connected to the drain of the first transistor, and a fifth end connected to the ground;
wherein a voltage output from the voltage regulator is lower than a voltage of the power supply.

2. The amplifier circuit according to claim 1, further comprising a bias resistor; wherein the drain of the first transistor is connected to the ground through the bias resistor.

3. The amplifier circuit according to claim 1, wherein the first and second transistors are P-channel metal oxide semiconductor (PMOS) transistors.

4. The amplifier circuit according to claim 1, wherein the voltage regulator is a low dropout regulator (LDO).

5. The amplifier circuit according to claim 1, wherein the first driver includes:

a bias current source, having an input terminal serving as the first end of the first driver;

a third transistor, having a gate serving as the fourth end of the first driver, a source serving as the fifth end of the first driver, and a drain serving as the third end of the first driver;

a fourth transistor, having a gate connected to the gate of the third transistor, a source connected to the source of the third transistor and a drain connected to an output terminal of the bias current source;

a fifth transistor, having a source connected to the drain of the third transistor, a gate connected to the drain of the fourth transistor and a drain; and a sixth transistor, having a gate serving as the second end of the first driver, a drain connected to the input terminal of the bias current source, and a source connected to the drain of the fifth transistor.

6. The amplifier circuit according to claim 5, wherein the first driver further includes a capacitor, having a first end connected to the gate of the fifth transistor, and a second end connected to the gate of the third transistor.

7. The amplifier circuit according to claim 5, wherein the third transistor, the fourth transistor, the fifth transistor, and the sixth transistor are N-channel metal oxide semiconductor (NMOS) transistors.

8. The amplifier circuit according to claim 1, wherein the second driver includes:

a second constant current source, having an input terminal serving as the second end of the second driver and an output terminal;

a seventh transistor, having a gate serving as the fourth end of the second driver, a source serving as the fifth end of the second driver, and a drain connected to the output terminal of the second constant current source;

an eighth transistor, having a source connected to the source of the seventh transistor, a drain connected to the drain of the seventh transistor, and a gate connected to the drain of the eighth transistor;

a ninth transistor, having a source connected to the source of the seventh transistor, a gate connected to the gate of the eighth transistor and a drain;

a tenth transistor, having a source serving as the first end of the second driver, a drain serving as the third end of the second driver, and a gate connected to the drain of the ninth transistor; and an eleventh transistor, having a source connected to the source of the tenth transistor, a gate connected to the gate of the tenth transistor, and a drain connected to the gate of the eleventh transistor.

9. The amplifier circuit according to claim 8, wherein the seventh transistor, the eighth transistor, and the ninth transistor are NMOS transistors, and the tenth and eleventh transistors are PMOS transistors.

10. A microphone circuit, comprising:

an amplifier circuit including:

a voltage regulator, having an output terminal;

a first constant current source, having an input terminal connected to the output terminal of the voltage regulator;

a first transistor, having a gate serving as an input terminal of the amplifier circuit, a source serving as an output terminal of the amplifier circuit, and a drain;

a second transistor, having a source connected to an output terminal of the first constant current source, a gate connected to the source of the first transistor, and a drain connected to ground;

a first driver, having a first end connected to the output terminal of the voltage regulator, a second end connected to the source of the second transistor, a third end connected to the source of the first transistor, a fourth end connected to the drain of the first transistor, and a fifth end connected to the ground; and a second driver, having a first end connected to a power supply, a second end connected to the output terminal of the voltage regulator, a third end connected to the source of the first transistor, a fourth end connected to the drain of the first transistor, and a fifth end connected to the ground;

wherein a voltage output from the voltage regulator is lower than a voltage of the power supply; and a microphone, having a first end connected to a microphone bias voltage, and a second end connected to the input terminal of the amplifier circuit.

11. The microphone circuit according to claim 10, wherein the amplifier circuit includes a bias resistor, having a first end connected to the drain of the first transistor and a second end connected to the ground.

12. The microphone circuit according to claim 10, wherein the first and second transistors are P-channel metal oxide semiconductor (PMOS) transistors.

13. The microphone circuit according to claim 10, wherein the voltage regulator is a low dropout regulator (LDO).

14. The microphone circuit according to claim 10, wherein the first driver includes:

a bias current source, having an input terminal serving as the first end of the first driver;

a third transistor, having a gate serving as the fourth end of the first driver, a source serving as the fifth end of the first driver, and a drain serving as the third end of the first driver;

a fourth transistor, having a gate connected to the gate of the third transistor, a source connected to the source of the third transistor and a drain connected to an output terminal of the bias current source;

a fifth transistor, having a source connected to the drain of the third transistor, a gate connected to the drain of the fourth transistor and a drain; and a sixth transistor, having a gate serving as the second end of the first driver, a drain connected to the input terminal of the bias current source, and a source connected to the drain of the fifth transistor.

15. The microphone circuit according to claim 14, wherein the first driver further includes a capacitor, having a first end connected to the output terminal of the bias current source, and a second end connected to the gate of the third transistor.

16. The microphone circuit according to claim 14, wherein the third transistor, the fourth transistor, the fifth transistor, and the sixth transistor are N-channel metal oxide semiconductor (NMOS) transistors.

17. The microphone circuit according to claim 10, wherein the second driver includes:

a second constant current source, having an input terminal serving as the second end of the second driver and an output terminal;

a seventh transistor, having a gate serving as the fourth end of the second driver, a source serving as the fifth end of the second driver, and a drain connected to the output terminal of the second constant current source;

an eighth transistor, having a source connected to the source of the seventh transistor, a drain connected to the drain of the seventh transistor, and a gate connected to the drain of the eighth transistor;

a ninth transistor, having a source connected to the source of the seventh transistor, a gate connected to the gate of the eighth transistor and a drain;

a tenth transistor, having a source serving as the first end of the second driver, a drain serving as the third end of the second driver, and a gate connected to the drain of the ninth transistor; and an eleventh transistor, having a source connected to the source of the tenth transistor, a gate connected to the gate of the tenth transistor, and a drain connected to the gate of the eleventh transistor.

18. The amplifier circuit according to claim 17, wherein the seventh transistor, the eighth transistor, and the ninth transistor are NMOS transistors, and the tenth and eleventh transistors are PMOS transistors.

19. An electronic device, comprising the amplifier circuit for the microphone according to claim 1.

* * * * *